US012588435B2

(12) United States Patent
Yu et al.

(10) Patent No.: US 12,588,435 B2
(45) Date of Patent: ***Mar. 24, 2026

(54) SELECTIVE INHIBITION FOR SELECTIVE METAL DEPOSITION

(71) Applicant: Tokyo Electron Limited, Tokyo (JP)

(72) Inventors: Kai-Hung Yu, Albany, NY (US); Robert D. Clark, Fremont, CA (US); Ryota Yonezawa, Albany, NY (US); Hiroaki Niimi, Albany, NY (US); Hidenao Suzuki, Albany, NY (US); Kandabara Tapily, Albany, NY (US); Takahiro Miyahara, Albany, NY (US); Cory Wajda, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 410 days.

This patent is subject to a terminal disclaimer.

(21) Appl. No.: 18/156,142

(22) Filed: Jan. 18, 2023

(65) Prior Publication Data

US 2023/0274932 A1 Aug. 31, 2023

Related U.S. Application Data

(60) Provisional application No. 63/315,062, filed on Feb. 28, 2022.

(51) Int. Cl.
*H01L 21/02* (2006.01)
*H01L 21/768* (2006.01)
(52) U.S. Cl.
CPC .... *H01L 21/0228* (2013.01); *H01L 21/76879* (2013.01)

(58) Field of Classification Search
None
See application file for complete search history.

(56) References Cited

U.S. PATENT DOCUMENTS

| | | | |
|---|---|---|---|
| 11,024,535 B2 | 6/2021 | Yu et al. | |
| 11,094,543 B1 | 8/2021 | Han et al. | |

(Continued)

FOREIGN PATENT DOCUMENTS

| | | |
|---|---|---|
| WO | 2019183035 A1 | 9/2019 |
| WO | 2021262527 A1 | 12/2021 |

OTHER PUBLICATIONS

U.S. Appl. No. 18/145,582. (Year: 2023).*

(Continued)

*Primary Examiner* — Asok K Sarkar
(74) *Attorney, Agent, or Firm* — Slater Matsil, LLP

(57) ABSTRACT

A method for processing a substrate includes treating the substrate with a small molecular inhibitor (SMI), the substrate including a recess formed in a dielectric layer and a first metal layer in the recess, the SMI covering a surface of the first metal layer. The method further includes, after treating the substrate with the SMI, treating the substrate with a large molecular inhibitor (LMI), the LMI covering sidewalls of the dielectric layer in the recess. The method further includes heating the substrate to remove the SMI from the first metal layer and to expose the first metal layer in the recess, where the LMI remains on the sidewalls after removing the SMI from the first metal layer. The method further includes depositing a second metal over the first metal layer in the recess, where the LMI covering the sidewalls prevents deposition of the second metal on the dielectric layer.

20 Claims, 7 Drawing Sheets

(56) References Cited

U.S. PATENT DOCUMENTS

| 11,282,745 | B2 | 3/2022 | Yu et al. | |
|---|---|---|---|---|
| 2010/0248473 | A1 | 9/2010 | Ishizaka et al. | |
| 2019/0295891 | A1 | 9/2019 | Clark et al. | |
| 2020/0064737 | A1 | 2/2020 | De Roest | |
| 2020/0118871 | A1* | 4/2020 | Yu | H01L 21/76888 |
| 2020/0343136 | A1 | 10/2020 | Yu et al. | |
| 2020/0347493 | A1 | 11/2020 | Liu et al. | |
| 2021/0317570 | A1 | 10/2021 | Yoon et al. | |
| 2022/0208542 | A1 | 6/2022 | Maes et al. | |
| 2023/0245924 | A1 | 8/2023 | Narkeviciute et al. | |

OTHER PUBLICATIONS

International Searching Authority, "Notification of Transmittal of The International Search Report and The Written Opinion of The International Searching Authority, or The Declaration," International application No. PCT/US2023/063327, Date of mailing Jun. 28, 2023, 12 pages.

Merkx et al., "Area-Selective Atomic Layer Deposition of TiN Using Aromatic Inhibitor Molecules for Metal/Dielectric Selectivity," American Chemical Society, Chemistry of Materials, vol. 32, No. 18, Aug. 13, 2020, p. 7788-7795, 8 pages total.

Gordon et al., "Trends in Copper Precursor Development for CVD and ALD Applications," ECS Journal of Solid State Science and Technology, vol. 4, No. 1, pp. N3188-3197, Dec. 9, 2014, 11 pages.

International Search Report and Written Opinion, PCT/US2023/078497, mailed Feb. 28, 2024, Total pp. 13.

Yang et al., "The role of iodide promoters and the mechanism of ethylene carbonylation catalyzed by molybdenum hexacarbonyl," Journal of Catalysis 319, pp. 211-219, Sep. 9, 2014, 9 pages.

* cited by examiner

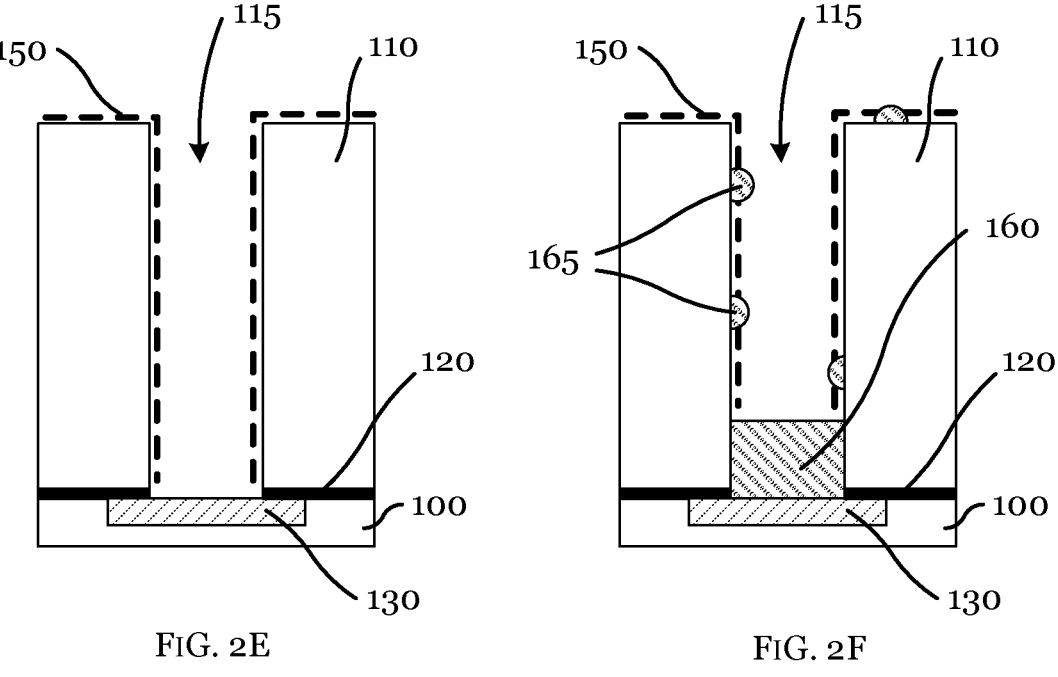
FIG. 2E           FIG. 2F
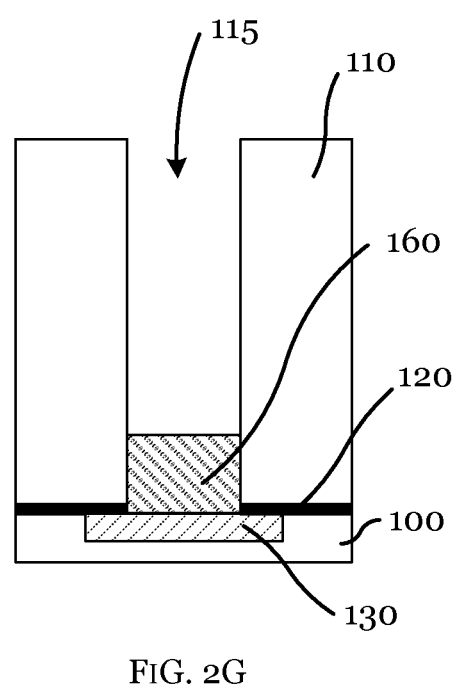
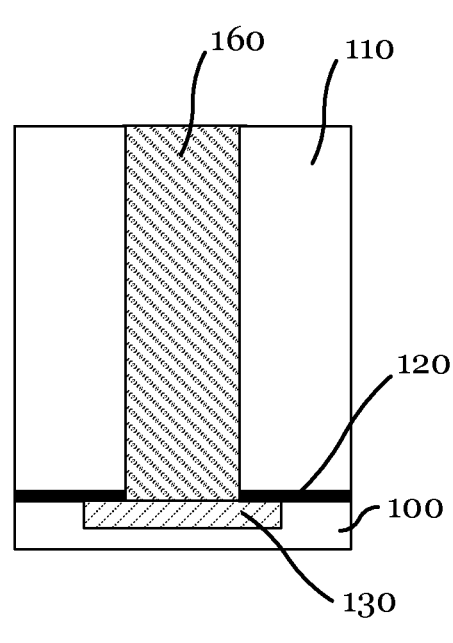
FIG. 2G           FIG. 2H

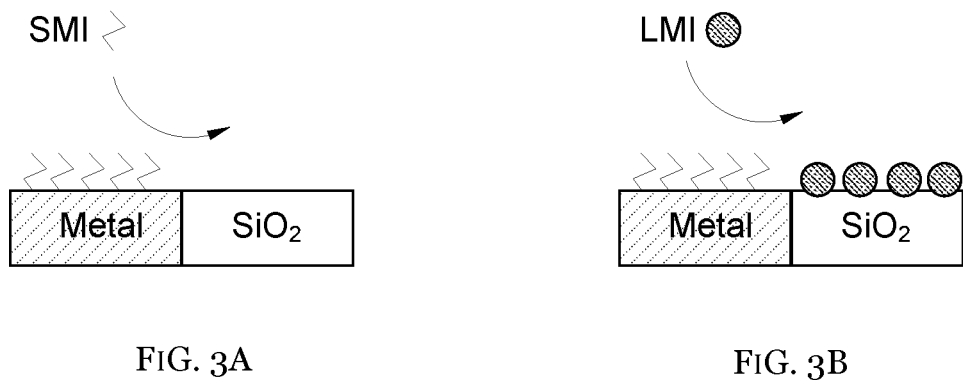
FIG. 3A                                              FIG. 3B
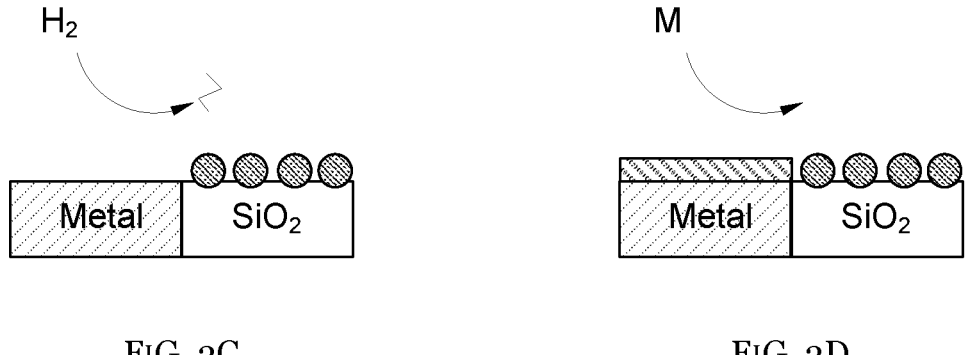
FIG. 3C                                              FIG. 3D

42

CYCLIC CHEMICAL VAPOR DEPOSITION (CVD) TO FILL RECESS

TREAT SUBSTRATE WITH SMALL MOLECULAR INHIBITOR (SMI)    412

TREAT SUBSTRATE WITH LARGE MOLECULAR INHIBITOR (LMI) TO COVER SIDEWALLS OF DIELECTRIC LAYER    422

HEAT SUBSTRATE TO REMOVE SMI FROM FIRST METAL LAYER    432

DEPOSIT SECOND METAL OVER FIRST METAL LAYER    442

REMOVE SECOND METAL NUCLEI FROM SIDEWALLS    452

SELECTIVE INHIBITION FOR SELECTIVE METAL DEPOSITION

TECHNICAL FIELD

The present invention relates generally to methods of processing a substrate, and, in particular embodiments, to selective inhibition for selective metal deposition.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Scaling efforts to increase the number of interconnect elements per unit area are running into greater challenges as scaling enters nanometer-scale semiconductor device fabrication nodes. Therefore, there is a desire for three-dimensional (3D) semiconductor devices in which transistors are stacked on top of each other.

As device structures densify and develop vertically, the desire for precision material processing, for example, during deposition and patterning, becomes more compelling. Thus, further innovations are desired in various deposition techniques such as chemical vapor deposition (CVD), physical vapor deposition (PVD), and atomic layer deposition (ALD), to provide sufficient deposition rate, profile control, film conformality, and film quality among others.

SUMMARY

In accordance with an embodiment of the present invention, a method for processing a substrate includes treating the substrate with a small molecular inhibitor (SMI), the substrate including a recess formed in a dielectric layer and a first metal layer in the recess, the SMI covering a surface of the first metal layer. The method further includes, after treating the substrate with the SMI, treating the substrate with a large molecular inhibitor (LMI), the LMI covering sidewalls of the dielectric layer in the recess. The method further includes heating the substrate to remove the SMI from the first metal layer and to expose the first metal layer in the recess, where the LMI remains on the sidewalls after removing the SMI from the first metal layer. The method further includes depositing a second metal over the first metal layer in the recess, where the LMI covering the sidewalls prevents deposition of the second metal on the dielectric layer.

In accordance with an embodiment of the present invention, a method for processing a substrate includes performing a cyclic chemical vapor deposition (CVD) process, the substrate including a dielectric layer having a recess and a first metal layer at a bottom of the recess. In accordance with the method, one cycle of the cyclic CVD process includes treating the substrate with a small molecular inhibitor (SMI), the SMI covering a surface of a second metal formed over the first metal layer, and treating the substrate with a large molecular inhibitor (LMI) after treating the substrate with the SMI, the LMI covering sidewalls of the dielectric layer in the recess. In accordance with the method, one cycle of the cyclic CVD process includes heating the substrate to remove the SMI from over the second metal and to expose the second metal, where the LMI remains on the sidewalls, and depositing the second metal over the first metal layer in the recess, where the LMI covering the sidewalls prevents deposition of the second metal on the dielectric layer.

In accordance with an embodiment of the present invention, a method for processing a substrate includes exposing the substrate to a first vapor including a small molecular inhibitor (SMI), the substrate including a dielectric surface and a first metal surface, the SMI adsorbing on the first metal surface selectively to the dielectric surface. The method includes exposing the substrate to a second vapor including a large molecular inhibitor (LMI), the LMI selectively adsorbing on the dielectric surface, the adsorbed SMI preventing the LMI from adsorbing on the first metal surface. The method includes removing the SMI from the first metal surface without removing the LMI from the dielectric surface, and depositing a second metal over the first metal surface by chemical vapor deposition (CVD), where a deposition rate over the first metal surface is at least 100 times as high as a deposition rate over the dielectric surface.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1B schematically illustrate an impurity interface issue caused by a conventional chemical vapor deposition (CVD) process for metal deposition, wherein FIG. 1A illustrates a cross sectional view of an example substrate during the conventional CVD process, and FIG. 1B illustrates a cross sectional view of the substrate after cycles of the conventional CVD process;

FIGS. 2A-2H illustrate cross sectional views of a substrate at various stages of a metal deposition process in accordance with various embodiments, wherein FIG. 2A illustrates an incoming substrate comprising a first metal layer and a dielectric layer with a recess feature, FIG. 2B illustrates the substrate after a pretreatment to expose the first metal layer, FIG. 2C illustrates the substrate after a selective treatment with a small molecular inhibitor (SMI), FIG. 2D illustrates the substrate after a selective treatment with a large molecular inhibitor (LMI), FIG. 2E illustrates the substrate after removing the SMI, FIG. 2F illustrates the substrate after depositing a second metal, FIG. 2G illustrates the substrate after a metal nuclei removal etch, and FIG. 2H illustrates the substrate after cycles of the metal deposition process to fill the recess with the second metal;

FIGS. 3A-3D schematically illustrate step-wise area-selective surface modification of the metal deposition process in accordance with one embodiment, wherein FIG. 3A illustrates selective adsorption of the small molecular inhibitor (SMI) onto a metal, FIG. 3B illustrates selective adsorption of the large molecular inhibitor (LMI) onto silicon oxide, FIG. 3C illustrates selective removal of the SMI by a $H_2$ treatment, and FIG. 3D illustrates selective metal deposition onto the metal; and FIGS. 4A-4C illustrate process flow diagrams of the methods of metal deposition process in accordance with various embodiments, wherein FIG. 4A illustrates an embodiment, FIG. 4B illustrates another embodiment, and FIG. 4C illustrates yet another embodiment.

DETAILED DESCRIPTION OF ILLUSTRATIVE EMBODIMENTS

Figure 1A:
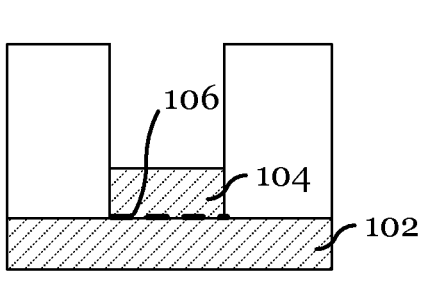

This application relates to methods of processing a substrate, more particularly to selective metal deposition using two types of molecular inhibitors. Generally, conductive materials are used in semiconductor devices to enable electrical connections between various components. Although copper (Cu) has been used for interconnects in integrated circuits (ICs) for decades, new conductive materials with lower electrical resistivity (e.g., Ru, Mo, Co, and W) have been tested as superior candidates for applications such as sub-10 nm node middle of line (MOL) and back end of line (BEOL) logic interconnects. Further, some of these new conductive materials, unlike Cu, may not require a diffusion barrier layer, which advantageously simplifies the fabrication process. However, depositing and patterning these metal materials with sufficient selectivity in high-aspect ratio (HAR) features at small scale has been difficult. In order to fill a high HAR recess with a metal without any void or pinch-off issues, bottom-up, selective metal deposition is desired. One solution is to use a molecular inhibitor during a deposition process, which may preferentially deposit metal on a metal surface compared to the inhibitor-covered surface of, for example, a dielectric. However, the inhibitor may also adsorb on the metal surface to cause impurity issues and decrease the metal deposition rate. Therefore, a new method for selective metal deposition may be desired.

Embodiments of the present application disclose methods of selective metal deposition with two different molecular inhibitors: one for a metal surface and the other for a dielectric surface. In various embodiments, the metal surface may first be treated and passivated with a first molecular inhibitor (e.g., a small molecular inhibitor, SMI). The dielectric surface may then be treated and passivated with a second molecular inhibitor (e.g., a large molecular inhibitor, LMI), where the presence of the SMI may prevent the undesired LMI adsorption on the metal surface. After the passivation of the dielectric surface with the LMI, the SMI may then be removed from the metal surface such that a subsequent metal deposition process (e.g., CVD) may occur preferentially on the exposed metal surface while the LMI prevents metal deposition on the dielectric. The methods may be applied as a cyclic process to fill a high-aspect ratio (HAR) recess.

The methods described in this disclosure may advantageously improve the selectivity of various metal deposition methods. With the improved selectivity, the methods of metal deposition may overcome the impurity issue at metal-metal interfaces. The methods may particularly be advantageous for fabrication processes for sub-10 nm node middle of line (MOL) and back end of line (BEOL) logic interconnects, and may also enable using new metal materials such as Ru, Mo, Co, and W for these applications. Although various embodiments of the methods are primarily described as CVD in this disclosure, the use of two molecular inhibitors may also be applied in other methods such as atomic layer deposition (ALD) and wet processes.

Figure 4A:
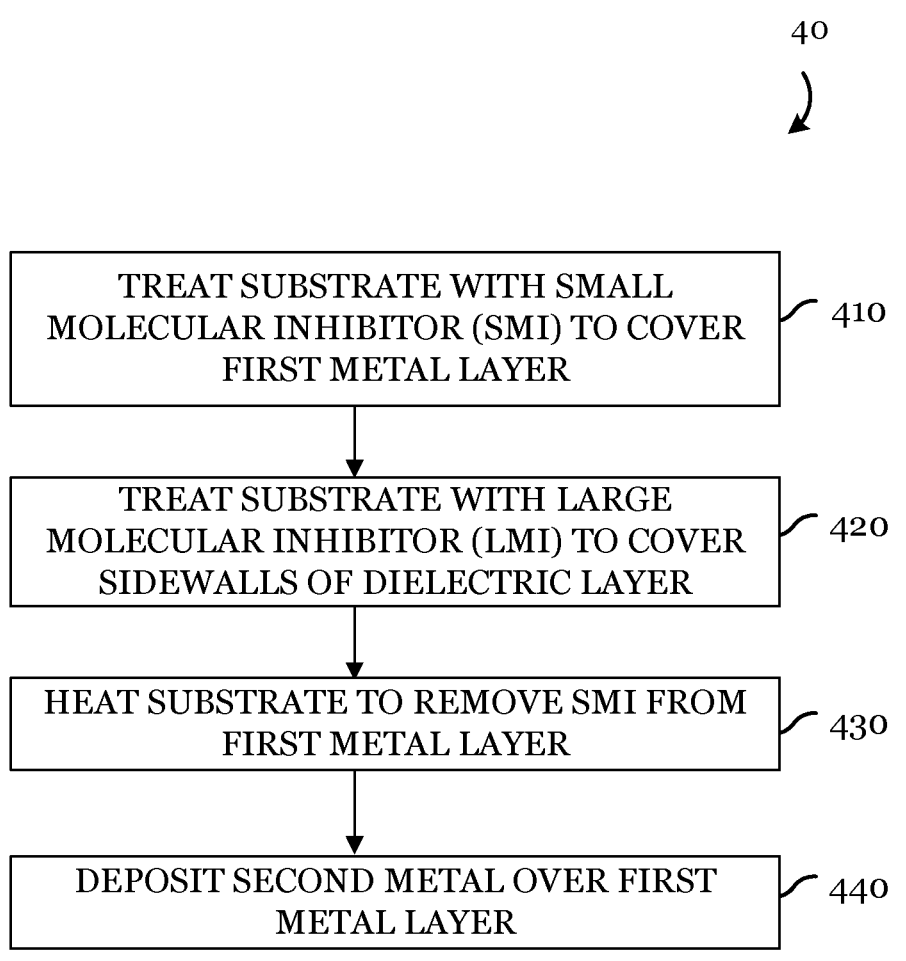
Figure 4B:
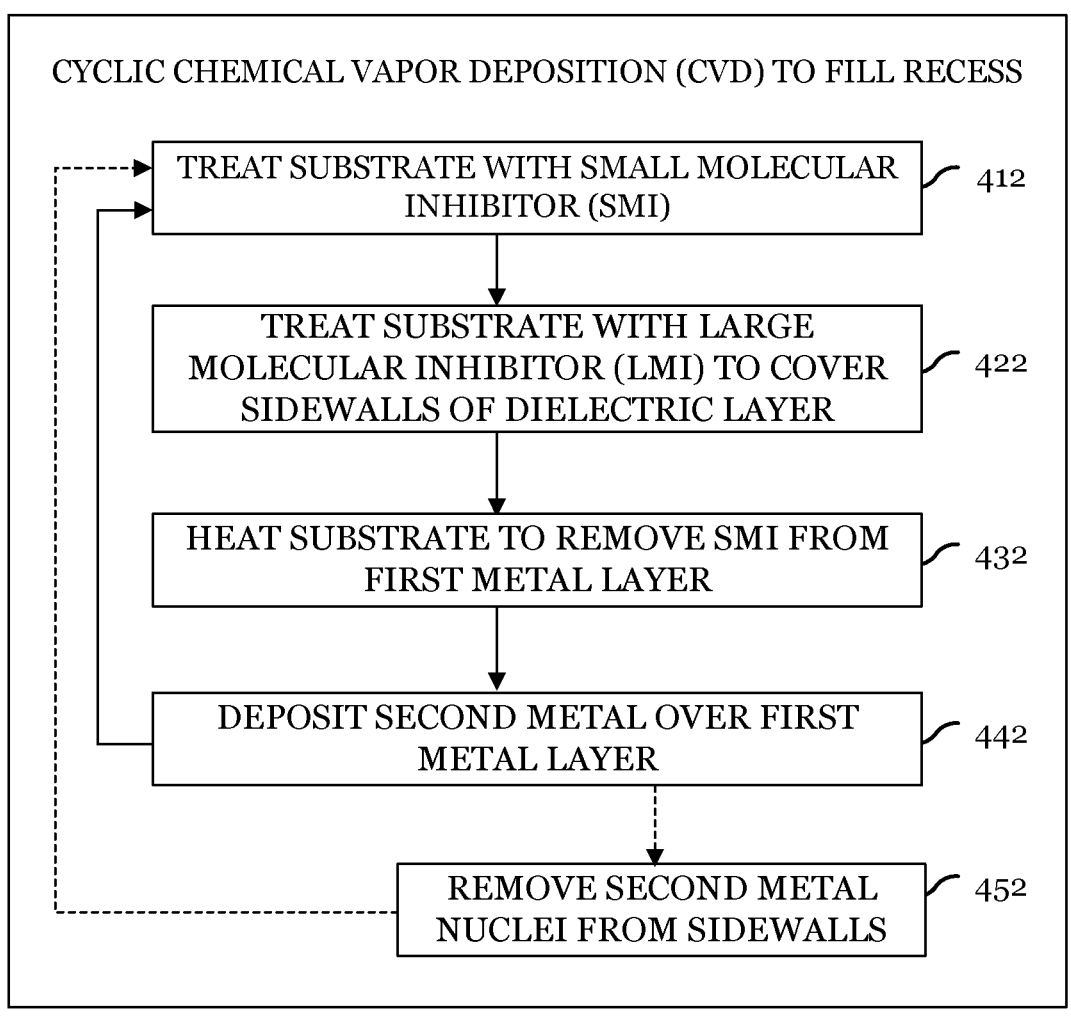
Figure 4C:
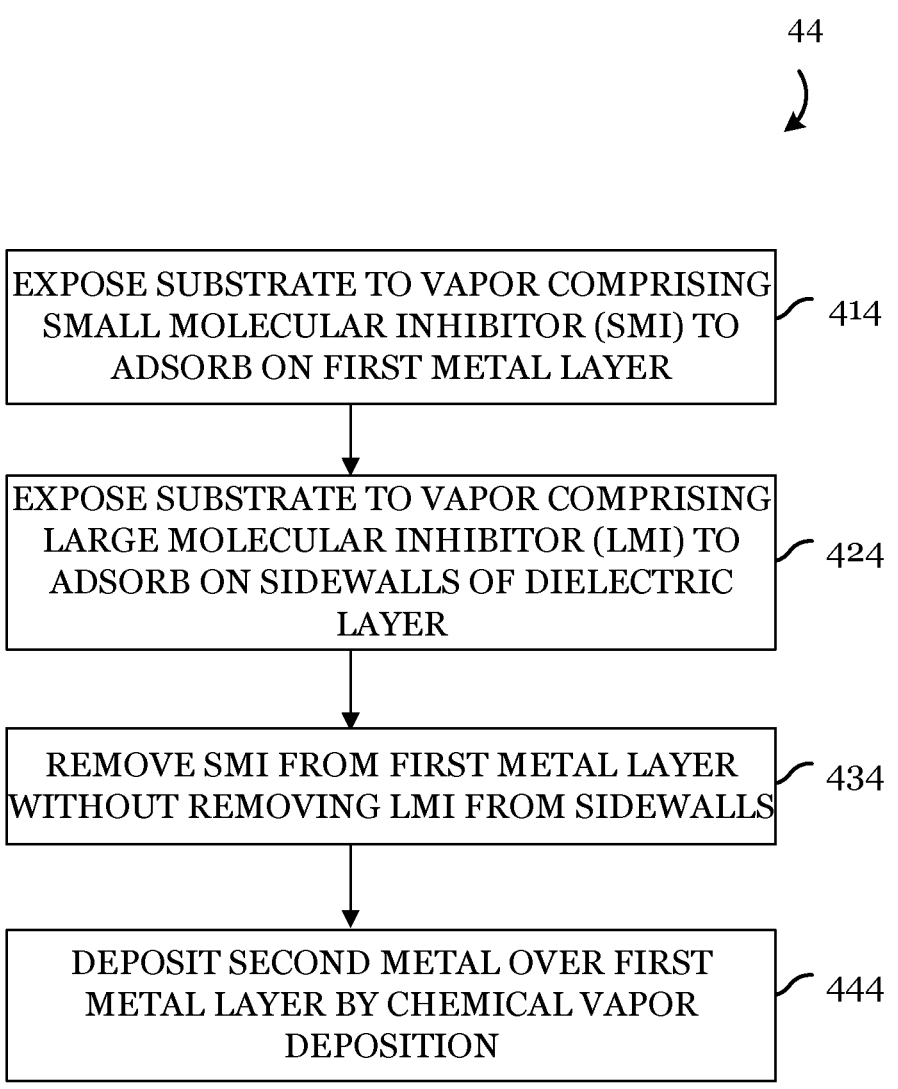

In the following, the impurity interface issue of conventional CVD methods is first described referring to FIGS. 1A-1B. Subsequently, the steps of the CVD methods using two molecular inhibitors are described referring to FIGS. 2A-2H and 3A-3D in accordance with various embodiments. Example process flow diagrams are illustrated in FIG. 4A-4C. All figures in this disclosure are drawn for illustration purpose only and not to scale, including the aspect ratios of features.

Figure 1B:
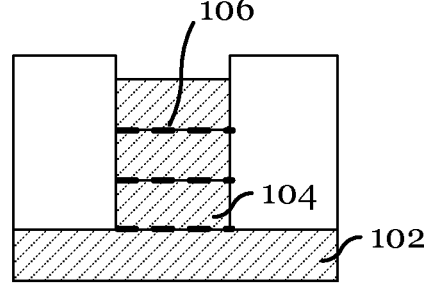

FIGS. 1A-1B schematically illustrate an impurity interface issue caused by a conventional chemical vapor deposition (CVD) process for metal deposition.

In FIG. 1A, a cross sectional view of an example substrate with a recess during the conventional CVD process using a molecular inhibitor is illustrated, where the conventional CVD process selectively deposits a second metal 104 over a first metal 102 to fill the recess. Although the molecular inhibitor may prevent the metal deposition on sidewalls, it may also form an impurity layer 106 (e.g., Si-containing) at an interface between the first metal 102 and the second metal 104. When the conventional CVD process is performed cyclically (FIG. 1B), the impurity layer 106 may be formed at each metal-metal interface. The impurity layer 106 is often detrimental to the quality of the metal interconnects, and furthermore, it may also decrease the metal deposition rate during the CVD process. The inventors of this application identified that this impurity issue is caused by the undesired passivation of the metal surface by the molecular inhibitor. As further described in the following referring to FIGS. 2A-2H and 3A-3D, the methods of metal deposition described in this disclosure may advantageously solve this impurity issue by pre-passivating the metal surface with another molecular inhibitor that can be readily moved in a subsequent step.

FIGS. 2A-2H illustrate cross sectional views of a substrate 100 at various stages of a metal deposition process in accordance with various embodiments. The selective surface modification of the metal deposition process is further schematically illustrated in FIGS. 3A-3D, which will be described along with FIGS. 2C-2F, respectively.

Figure 2A:
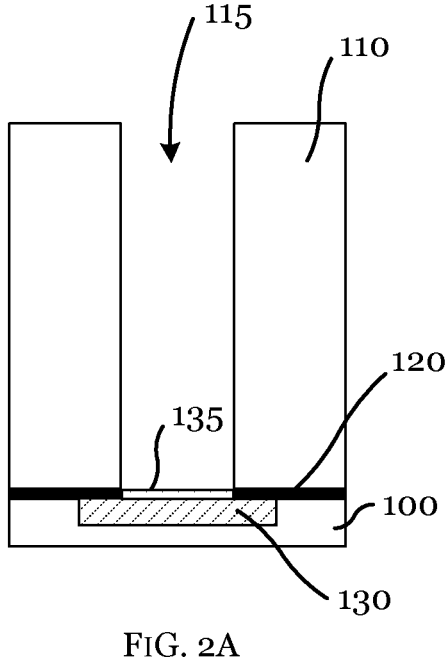

FIG. 2A illustrates a cross-sectional view of an incoming substrate 100. In various embodiments, the substrate 100 may be a part of, or includes, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As further illustrated in FIG. 2A, the substrate 100 may comprise a recess 115 formed in a dielectric layer 110. In certain embodiments, the substrate 100 may further comprise an etch stop layer (ESL) 120 as a bottom layer of the dielectric layer 110, and a first metal layer 130 at the bottom of the recess 115. As illustrated in FIG. 2A, in one or more embodiments, a surface oxide layer 135 may be present on the surface of the first metal layer 130.

In various embodiments, the dielectric layer 110 may silicon oxide, a low dielectric constant (low-k) material such as fluorinated silicon glass (FSG), carbon doped oxide, a polymer, a SiCOH-containing low-k material, a non-porous low-k material, a porous low-k material, a CVD low-k material, a spin-on dielectric (SOD) low-k material, or any other suitable dielectric material, including a high dielectric constant (high-k) material. In certain embodiments, a critical dimension (CD) of the recess 115 may be between about 10 nm and about 65 nm for via dominant structure, or between about 10 nm and about 100 nm for trench dominant in another embodiment. In one or more embodiments, the depth of the recess 115 may be between about 40 nm and about 80 nm for single damascene structure, or between about 80 nm and about 150 nm for dual damascene structure. In various embodiments, the recess 115 may have an aspect ratio between about 4 and about 8 for single damascene, or between about 6 and about 10 for dual damascene.

The first metal layer 130 may comprise a low-resistivity metal such as copper (Cu), ruthenium (Ru), cobalt (Co), molybdenum (Mo) or tungsten (W). Although not illustrated in FIG. 2A, in certain embodiments, the first metal layer 130 may comprise two or more stacked conductive layers. Examples of the stacked conductive layers include Co metal on Cu metal (Co/Cu) and Ru metal on Cu metal (Ru/Cu).

The ESL 120 may comprise a dielectric such as silicon nitride, silicon oxynitride, silicon carbide, or silicon carbonitride. The ESL 120 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In certain embodiments, the thickness of the ESL 120 may be between 2 nm to 5 nm.

Figure 2B:
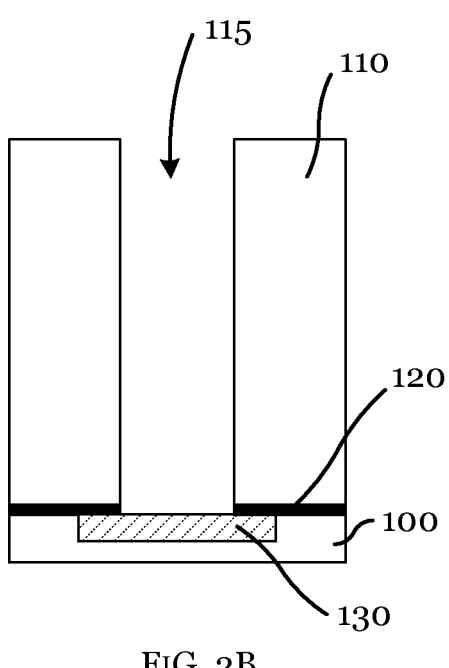

FIG. 2B illustrates a cross sectional view of the substrate 100 after a pretreatment to expose the first metal layer 130.

In various embodiments, prior to any treatment with molecular inhibitors for selective metal deposition, the pretreatment may be performed to remove the surface oxide layer 135 and to expose the first metal layer 130. The pretreatment may comprise treating the surface oxide layer 135, for example, with a plasma comprising dihydrogen ($H_2$). In other embodiments, the pretreatment may be skipped if the substrate 100 is already free from any surface oxide.

Figure 2C:
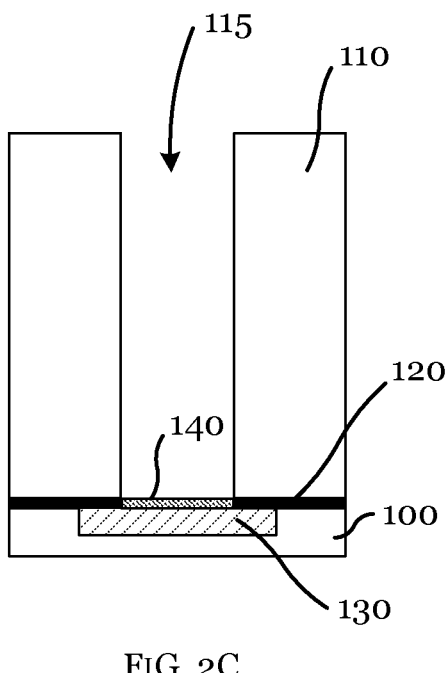

FIG. 2C illustrates a cross sectional view of the substrate after a selective treatment with a small molecular inhibitor (SMI).

FIG. 3A illustrates selective adsorption of the SMI onto a metal in accordance with one embodiment.

In FIG. 2C, the substrate 100 may be treated with a small molecular inhibitor (SMI) to selectively cover the exposed surface of the first metal layer 130, resulting in a passivated first metal surface 140. In one embodiment, as illustrated in FIG. 3A, the SMI may only adsorb on a metal selectively to a dielectric surface such as silicon oxide. With the SMI passivating the first metal layer 130, a subsequent step with another molecular inhibitor may advantageously adsorb selectively on the dielectric layer 110. In various embodiments, the SMI may be vaporized and delivered to the substrate 100 as a vapor diluted in a carrier gas (e.g., $N_2$), where the substrate temperature about room temperature may be maintained. In one embodiment, this exposure with the SMI may be performed for 1-120 s with heated stage or temperature-elevated techniques.

In various embodiments, the SMI may comprise a nitrogen-containing compound, and in certain embodiments, the nitrogen-containing compound comprises $NH_3$, $N_2H_4$, or an aromatic compound. Examples of nitrogenous aromatic SMI include pyridine, pyrimidine, pyrazine, pyrrole, imidazole, pyrazole, aniline, and benzotriazole (BTA). In other embodiments, the SMI may comprise R—$PO_3H$, R—COOH, R—SH, or R—$SO_x$. In various embodiments, any suitable molecular inhibitor may be used, where it satisfies the following criteria: the SMI adsorbs on a metal layer (e.g., the first metal layer 130) selectively to other layers (e.g., the dielectric layer 110); and the metal layer may be regenerated by a later removal step for the SMI. In one or more embodiments, the SMI may be oxygen-free to prevent any chance of oxygen interacting with the metal and cause impurity issues.

Figure 2D:
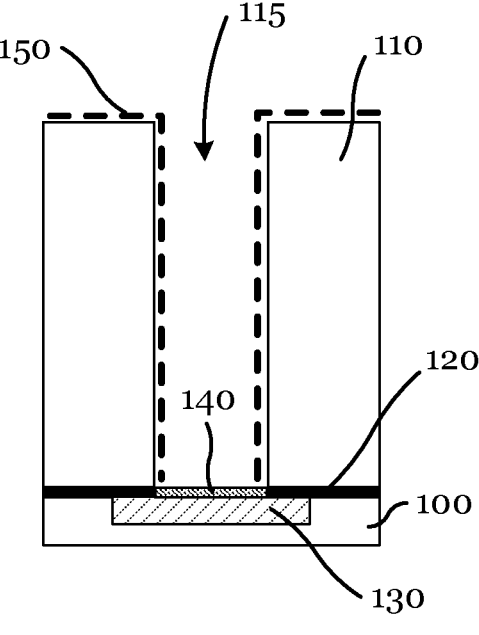

FIG. 2D illustrates the substrate 100 after a selective treatment with a large molecular inhibitor (LMI).

FIG. 3B illustrates selective adsorption of the LMI onto a silicon oxide surface.

In FIG. 2D, the substrate 100 may be treated with a large molecular inhibitor (LMI). The LMI may selectively cover the exposed surface of the dielectric layer 110, both sidewalls and a top horizontal surface, resulting in a passivated dielectric surface 150. The presence of the SMI can prevent the undesired LMI adsorption on the first metal layer 130. This is further illustrated in FIG. 3B, where the LMI adsorbs only on the silicon oxide surface. Although not wishing to be limited by any theory, the treatment with the LIM may make the surface of the dielectric layer 110 more hydrophobic, which may be beneficial in reducing deposition of a metal precursor during a metal deposition step. In various embodiments, the LMI may be vaporized and delivered to the substrate 100 as a vapor diluted in a carrier gas (e.g., $N_2$). In certain embodiments, the treatment may be performed with a substrate temperature between about 80° C. and about 250° C., and a process chamber pressure of about 1-10 Torr, and a 1-120 s exposure time with no plasma excitation.

In various embodiments, the LMI comprises an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, dimethylsilane dimethylamine (DMSDMA), trimethylsilane dimethylamine (TMSDMA), bis(dimethylamino) dimethylsilane (BDMADMS), N,O bistrimethylsilyltrifluoroacetamide (BSTFA), or trimethylsilyl-pyrrole (TMS-pyrrole).

In this disclosure, the first molecular inhibitor used for passivating the metal surface (e.g., FIGS. 2C and 3A) is referred to as small molecular inhibitor (SMI) and the second molecular inhibitor used for passivating the dielectric surface (e.g., FIGS. 2D and 3B) is referred to as large molecular inhibitor (LMI) because of their relative molecular size in general. In one embodiment, a LMI may have a greater molecular weight than a SMI. In another embodiment, a LMI may have a greater molecular volume or surface area than a SMI. However, in various embodiments, as long as they enable sufficient selective passivation of respective surfaces, molecular inhibitors with any molecular size may be used.

FIG. 2E illustrates a cross sectional view of the substrate 100 after removing the SMI.

FIG. 3C illustrates selective removal of the SMI by a $H_2$ treatment.

After the steps of treating with two molecular inhibitors (e.g., FIGS. 2C and 2D), a SMI removal step may be performed. In various embodiments, the SMI removal step may be an annealing process at a temperature below 400° C. under an inert gas flow or a reductive environment (e.g., $H_2$). The reductive environment for the annealing process may advantageously minimize undesired reaction of the metal in the first metal layer 130 such as nitridation and oxidation. In certain embodiments, the annealing temperature may be between 250° C. and 400° C. such that the annealing process may not exceed the thermal budget for the target semiconductor device fabrication. As illustrated in FIGS. 2E and 3D, the annealing process may selectively remove the SMI from the metal surface (e.g., the first metal layer 130) while retaining the LMI on the dielectric surface (e.g., the dielectric layer 110). With this selective SMI removal, the metal surface is recovered and accessible for the subsequent metal deposition step.

FIG. 2F illustrates a cross sectional view of the substrate 100 after depositing a second metal 160.

FIG. 3D illustrates selective metal deposition onto the metal.

In various embodiments, the metal deposition step may performed using chemical vapor deposition (CVD), but in other embodiment, other techniques including wet process may be used. The second metal 160 may comprise a low-resistivity metal such as Cu, Ru, Co, or W. The second metal 160 may or may not be the same material used for the first metal layer 130. Although not illustrated in FIG. 2F, in certain embodiments, more than one metal may be deposited to form an alloy or stacked conductive layers. Because the sidewalls and top surface of the dielectric layer 110 is still passivated with the LMI, the second metal 160 may be selectively deposited over the first metal layer 130 and grow bottom-up.

In certain embodiments, Ru metal may be deposited by chemical vapor phase deposition (CVD) or atomic layer deposition (ALD) using Ru-containing precursors. Examples of Ru-containing precursors include $Ru_3(CO)_{12}$, (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), 4-dimethylpentadienyl)(methylcyclopentadienyl) ruthenium (Ru(DMPD)(MeCp)), and bis (ethylcyclopentadienyl) ruthenium (Ru(EtCp)$_2$), as well as combinations of these and other precursors. In one embodiment, the process condition for a Ru metal CVD process may include a process gas containing $Ru_3(CO)_{12}$ and CO (e.g., a gas flow ratio of about 1:100), a substrate temperature between about 100° C. and about 250° C., a process chamber pressure between about 1 mTorr and about 500 mTorr, and a 400 s exposure without plasma excitation that deposits between about 10 nm and 20 nm of Ru metal on the metal surface.

In various embodiments, as further illustrated in FIG. 2F, the metal deposition step may fill a portion of the recess 115, for example, about a fourth of the initial depth of the recess 115. In other embodiments, the recess 115 may be completely filled with one metal deposition step. In certain embodiments, the metal deposition step may be terminated at a certain height to avoid excessive formation of metal nuclei 165 over the dielectric layer 110. These metal nuclei 165 may be formed due to adsorption of the metal precursor on the LMI or imperfect passivation of the dielectric layer 110 by the LMI. The metal nuclei 165 over the dielectric layer 110, especially over the sidewalls, may lead to lateral growth of the second metal 160, potentially creating voids in the second metal 160 and causing pinch-off issues. Accordingly, in various embodiments, the metal deposition step may be performed as a cyclic process including a metal nuclei removal etch as described below (FIG. 2G), and the recess 115 may be filled with the cycles of the metal deposition process.

FIG. 2G illustrates a cross sectional view of the substrate 100 after a metal nuclei removal etch.

To minimize the undesired lateral metal growth, following the metal deposition step, the metal nuclei removal etch may be performed to clean the sidewalls and top surface of the dielectric layer 110. It may be preferable to remove the metal nuclei 165 before they become too large and more difficult to remove efficiently. As illustrated in FIG. 2G, after the metal nuclei removal etch, the LIM may also be removed from the dielectric layer 110. In certain embodiments, the metal nuclei removal etch may be performed using reactive ion etching (RIE), for example using plasma-excited $O_2$ gas and optionally adding a halogen-containing gas (e.g., $Cl_2$). In one embodiment, the process conditions for the $O_2$—$Cl_2$ RIE for the metal nuclei removal etch may include an etching comprising $O_2$ and $Cl_2$ (e.g., a gas flow ratio of about 100:1), a substrate temperature between about room temperature and about 370° C., plasma excitation using a capacitively coupled plasma (CCP) source with about 1200 W of RF power applied to a top electrode and between about 0 W and about 300 W of RF power applied to a bottom electrode, a process chamber pressure of about 5 mTorr, and a 40 s exposure time to remove the equivalent of about 5 nm of metal nuclei. In certain embodiments, the metal nuclei removal etch may be performed using chemical vaper etching (CVE). In another embodiment, a treatment with ozone ($O_3$) gas may also be used for the metal nuclei removal etch. The ozone for the ozone treatment may be generated from dioxygen ($O_2$) gas with UV excitation with an example process conditions as follows: process temperature between about 50° C. and 200° C.; pressure range between about 500 mT to 10 Torr diluted with Ar gas; ozone exposure duration between 1 s to 60 s; and ozone density between 100 g/m$^3$ and 300 g/m$^3$. The ozone treatment can be applied onto BEOL metallization without causing damage on low-k dielectric and may be advantageous over a $O_2$-plasma-based RIE.

In other embodiments, although not illustrated, the metal deposition (FIG. 2F) may be achieved without any metal nuclei (e.g., the metal nuclei 165 in FIG. 2F) over the sidewall of the dielectric layer 110, and in these cases, the metal nuclei removal etch may be skipped. In certain embodiments, the LMI may not completely stop metal deposition over the dielectric layer 110, while it may substantially slow the deposition rate. In one example, the deposition rate over the first metal layer 130 may be at least 100 times as high as the deposition rate over the dielectric layer 110.

FIG. 2H illustrates a cross sectional view of the substrate 100 after cycles of the metal deposition process to fill the recess 115 with the second metal 160.

In various embodiments, the methods of selective metal deposition process may be performed as a cyclic process by repeating the steps of selective SMI treatment (e.g., FIGS. 2C and 3A), selective LMI treatment (e.g., FIGS. 2D and 3B), selective SMI removal (e.g., FIGS. 2E and 3C), metal deposition (e.g., FIGS. 2F and 3D), and metal nuclei removal etch (e.g., FIG. 2G). Each cycle of the selective metal deposition process may fill a portion of the recess 115 with the second metal 160, and may be repeated until the recess 115 is completely filled. As illustrated in FIG. 2H, the filled recess may be free from impurity unlike the case with the conventional method illustrated in FIGS. 1A and 1B. In one embodiment, the impurity level (e.g., Si) in the filled recess may be below a detection limit (e.g., ±0.1 atom %)) of a common technique such as elemental analysis or X-ray photoelectron spectroscopy (XPS). Further, the filled recess may be void-free. In one embodiment, the recess 115 may be completely filled by four cycles of the selective metal deposition process, but in other embodiments, any number of cycles may be performed. In certain embodiments, process conditions for the steps of the selective metal deposition process may be adjusted for each cycle in view of the aspect ratio of the remaining recess. For example, the exposure time for the metal deposition for the first cycle may be shorter than those for the subsequent cycles because the metal nuclei formation over the sidewalls may be more likely to occur due to higher surface area. In certain embodiments, the cycles of the selective metal deposition process may use more than one deposition technique since the use of two molecular inhibitors in the methods is not limited to any particular deposition technique. In various embodiments, each step of selective metal deposition process (e.g., FIGS. 2A-2H) may be performed within the thermal budget for the target semiconductor device fabrication, for example, below 400° C.

FIGS. 4A-4C illustrate process flow diagrams of the methods of metal deposition process in accordance with various embodiments. The process flow can be followed with the figures (FIGS. 2C-2G) discussed above and hence will not be described again.

In FIG. 4A, a process flow 40 starts with treating a substrate with a small molecular inhibitor (SMI), where the substrate comprises a recess formed in a dielectric layer and a first metal layer in the recess (block 410, FIG. 2C). The surface of the first metal layer may be selectively covered with the SMI. After treating the substrate with the SMI, the substrate may then be treated with a large molecular inhibitor (LMI) to cover sidewalls of the dielectric layer in the recess (block 420, FIG. 2D). Subsequently, the substrate may be heated to remove the SMI from the first metal layer and to expose the first metal layer in the recess, while the LMI remains on the sidewalls (block 430, FIG. 2E). A second metal may then be selectively deposited over the first metal layer in the recess, where the LMI covering the sidewalls prevents deposition of the second metal on the dielectric layer (block 440, FIG. 2F).

In FIG. 4B, a cyclic chemical vapor deposition (CVD) process 42 starts with treating a substrate with a SMI to cover a surface of a metal (e.g., a first metal layer in a first cycle of the cyclic CVD process and a surface of a second metal in subsequent cycles) (block 412, FIG. 2C). The substrate may comprise a dielectric layer having a recess and the first metal layer exposed at a bottom of the recess. After treating the substrate with the SMI, the substrate may then be treated with a LMI to cover sidewalls of the dielectric layer in the recess (block 422, FIG. 2D). Subsequently, the substrate may be heated to remove the SMI from the first metal layer and to expose the first metal layer in the recess, where the LMI remains on the sidewalls (block 432, FIG. 2E). A second metal may then be selectively deposited over the first metal layer in the recess, where the LMI covering the sidewalls prevents deposition of the second metal on the dielectric layer (block 442, FIG. 2F). These steps (blocks 412, 422, 432, and 442) may be cyclically repeated in certain embodiments. In other embodiments, where depositing the second metal deposits second metal nuclei on a portion of the sidewalls, an additional etch may be inserted in one or more of the cycles of the cyclic CVD process to remove the second metal nuclei from the portion of the sidewalls (block 452, FIG. 2G).

In FIG. 4C, another process flow 44 starts with exposing a substrate to a first vapor comprising a SMI, where the substrate comprises a recess formed in a dielectric layer and a first metal layer in the recess (block 414, FIG. 2C). The SMI adsorbs on the first metal layer selectively to sidewalls of the dielectric layer in the recess. The substrate may then be exposed to a second vapor comprising a LMI (block 424, FIG. 2D), where the LMI selectively adsorbs on the sidewalls and the adsorbed SMI preventing the LMI from adsorbing on the first metal layer. Subsequently, the SMI may be removed from the first metal layer without removing the LMI from the sidewalls (block 434, FIG. 2E). A second metal may then be selectively deposited over the first metal layer in the recess by CVD, where the LMI covering the sidewalls prevents deposition of the second metal on the dielectric layer (block 444, FIG. 2F).

The selective metal deposition using two types of molecular inhibitors in various embodiments may advantageously eliminate or minimize the impurity issues from inhibitor contamination. The methods are particularly useful for vapor metal deposition to fill a high-aspect ratio (HAR) recess for applications such as sub-10 nm node middle of line (MOL) and back end of line (BEOL) logic interconnects, where the impurity, even at a very low level, hampers the conductivity and thereby device performance. Although the disclosure primarily describes embodiments for chemical vapor deposition of a low-resistivity metal (e.g., Cu, Ru, Co, and W), the methods may also be applied to atomic layer deposition (ALD) or other deposition techniques. Further, in certain embodiments, the methods may be used to deposit metal compounds (e.g., metal oxide and metal nitride), where the step of selective metal deposition may be followed by an additional treatment to convert the deposited metal into the metal compounds.

Example embodiments of the invention are summarized here. Other embodiments can also be understood from the entirety of the specification as well as the claims filed herein.

Example 1. A method for processing a substrate includes treating the substrate with a small molecular inhibitor (SMI), the substrate including a recess formed in a dielectric layer and a first metal layer in the recess, the SMI covering a surface of the first metal layer. The method further includes, after treating the substrate with the SMI, treating the substrate with a large molecular inhibitor (LMI), the LMI covering sidewalls of the dielectric layer in the recess. The method further includes heating the substrate to remove the SMI from the first metal layer and to expose the first metal layer in the recess, where the LMI remains on the sidewalls after removing the SMI from the first metal layer. The method further includes depositing a second metal over the first metal layer in the recess, where the LMI covering the sidewalls prevents deposition of the second metal on the dielectric layer.

Example 2. The method of example 1, where the substrate further includes a surface oxide layer over the first metal layer, and where the method further includes, prior to treating the substrate with the SMI, removing the surface oxide layer to expose the first metal layer in the recess.

Example 3. The method of one of examples 1 or 2, where depositing the second metal deposits second metal nuclei on a portion of the sidewalls, further including removing the second metal nuclei.

Example 4. The method of one of examples 1 to 3, where depositing the second metal is achieved bottom-up from the first metal layer without the second metal growing from the dielectric layer.

Example 5. The method of one of examples 1 to 4, where heating the substrate includes heating the substrate to a temperature between 250° C. and 400° C.

Example 6. The method of one of examples 1 to 5, where heating the substrate including exposing the substrate to a gas including dihydrogen (H2).

Example 7. The method of one of examples 1 to 6, where the SMI includes a nitrogen-containing compound.

Example 8. The method of one of examples 1 to 7, where the nitrogen-containing compound includes $NH_3$, $N_2H_4$, or an aromatic compound.

Example 9. The method of one of examples 1 to 8, where the SMI includes $R\text{---}PO_3H$, $R\text{---}COOH$, $R\text{---}SH$, or $R\text{---}SO_x$.

Example 10. The method of one of examples 1 to 9, where the LMI includes an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, dimethylsilane dimethylamine (DMSDMA), trimethylsilane dimethylamine (TMSDMA), bis(dimethylamino) dimethylsilane (BD-MADMS), N,O bistrimethylsilyltrifluoroacetamide (BSTFA), or trimethylsilyl-pyrrole (TMS-pyrrole).

Example 11. The method of one of examples 1 to 10, where the first metal layer includes Ru, Co, or W, and where the second metal includes Cu, Ru, Co, or W.

Example 12. A method for processing a substrate includes performing a cyclic chemical vapor deposition (CVD) process, the substrate including a dielectric layer having a recess and a first metal layer at a bottom of the recess. In accordance with the method, one cycle of the cyclic CVD process includes treating the substrate with a small molecular inhibitor (SMI), the SMI covering a surface of a second metal formed over the first metal layer, and treating the substrate with a large molecular inhibitor (LMI) after treating the substrate with the SMI, the LMI covering sidewalls of the dielectric layer in the recess. In accordance with the method, one cycle of the cyclic CVD process includes heating the substrate to remove the SMI from over the second metal and to expose the second metal, where the LMI remains on the sidewalls, and depositing the second metal over the first metal layer in the recess, where the LMI covering the sidewalls prevents deposition of the second metal on the dielectric layer.

Example 13. The method of example 12, where depositing the second metal deposits second metal nuclei on a portion of the sidewalls, and where one of the cyclic CVD process further includes removing the second metal nuclei from the portion of the sidewalls.

Example 14. The method of one of examples 12 or 13, where the cyclic CVD process fills the recess without forming any void.

Example 15. The method of one of examples 12 to 14, where the LMI includes a silane, and the second metal that fills the recess is without any detectable silicon or silane impurity.

Example 16. A method for processing a substrate includes exposing the substrate to a first vapor including a small molecular inhibitor (SMI), the substrate including a dielectric surface and a first metal surface, the SMI adsorbing on the first metal surface selectively to the dielectric surface. The method includes exposing the substrate to a second vapor including a large molecular inhibitor (LMI), the LMI selectively adsorbing on the dielectric surface, the adsorbed SMI preventing the LMI from adsorbing on the first metal surface. The method includes removing the SMI from the first metal surface without removing the LMI from the dielectric surface, and depositing a second metal over the first metal surface by chemical vapor deposition (CVD), where a deposition rate over the first metal surface is at least 100 times as high as a deposition rate over the dielectric surface.

Example 17. The method of example 16, where the removing includes treating the substrate with a gas including dihydrogen (H2) at a substrate temperature between 250° C. and 400° C.

Example 18. The method of one of examples 16 or 17, where the first metal layer includes Ru, Co, Mo, or W, and where the second metal includes Cu, Ru, Co, Mo, or W.

Example 19. The method of one of examples 16 to 18, where the SMI is silicon-free and the LMI includes silicon.

Example 20. The method of one of examples 16 to 19, where the substrate includes a recess, the recess includes the dielectric surface as sidewalls and the first metal surface as a bottom surface, the recess having a critical dimension (CD) between 10 nm and 650 nm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
   treating the substrate with a small molecular inhibitor (SMI), the substrate comprising a recess formed in a dielectric layer and a first metal layer in the recess, the SMI selectively adsorbed on the first metal layer and covering a surface of the first metal layer;
   after treating the substrate with the SMI, treating the substrate with a large molecular inhibitor (LMI), the LMI selectively adsorbed over the dielectric layer and covering sidewalls of the dielectric layer in the recess, the LMI having a greater molecular weight or molecular volume than the SMI;
   heating the substrate to remove the SMI from the first metal layer and to expose the first metal layer in the recess, wherein the LMI remains on the sidewalls after removing the SMI from the first metal layer; and
   depositing a second metal over the first metal layer in the recess, wherein the LMI covering the sidewalls prevents deposition of the second metal on the dielectric layer, a deposition rate of the second metal over the first metal layer being at least 100 times as high as the deposition rate of the second metal over the dielectric layer.

2. The method of claim 1, wherein the substrate further comprises a surface oxide layer over the first metal layer, further comprising, prior to treating the substrate with the SMI, removing the surface oxide layer to expose the first metal layer in the recess.

3. The method of claim 1, wherein depositing the second metal deposits second metal nuclei on a portion of the sidewalls, further comprising removing the second metal nuclei.

4. The method of claim 1, wherein depositing the second metal is achieved bottom-up from the first metal layer without the second metal growing from the dielectric layer.

5. The method of claim 1, wherein heating the substrate comprises heating the substrate to a temperature between 250° C. and 400° C.

6. The method of claim 1, wherein heating the substrate comprising exposing the substrate to a gas comprising dihydrogen (H2).

7. The method of claim 1, wherein the SMI comprises a nitrogen-containing compound.

8. The method of claim 7, wherein the nitrogen-containing compound comprises $NH_3$, $N_2H_4$, or an aromatic compound.

9. The method of claim 1, wherein the SMI comprises $R-PO_3H$, R—COOH, R—SH, or $R-SO_x$.

10. The method of claim 1, wherein the LMI comprises an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, dimethylsilane dimethylamine (DMSDMA), trimethylsilane dimethylamine (TMSDMA), bis(dimethylamino) dimethylsilane (BDMADMS), N,O bistrimethylsilyltrifluoroacetamide (BSTFA), or trimethylsilyl-pyrrole (TMS-pyrrole).

11. The method of claim 1, wherein the first metal layer comprises Ru, Co, or W, and wherein the second metal comprises Cu, Ru, Co, or W.

12. A method for processing a substrate, the method comprising:

performing a cyclic chemical vapor deposition (CVD) process, the substrate comprising a dielectric layer having a recess and a first metal layer at a bottom of the recess, one cycle of the cyclic CVD process comprising:

treating the substrate with a small molecular inhibitor (SMI), the SMI selectively adsorbed on the first metal layer and covering a surface of a second metal formed over the first metal layer;

after treating the substrate with the SMI, treating the substrate with a large molecular inhibitor (LMI), the LMI selectively adsorbed over the dielectric layer and covering sidewalls of the dielectric layer in the recess, the LMI having a greater molecular weight or molecular volume than the SMI;

heating the substrate to remove the SMI from over the second metal and to expose the second metal, wherein the LMI remains on the sidewalls; and depositing the second metal over the first metal layer in the recess, wherein the LMI covering the sidewalls prevents deposition of the second metal on the dielectric layer.

13. The method of claim 12, wherein depositing the second metal deposits second metal nuclei on a portion of the sidewalls, and wherein the one cycle of the cyclic CVD process further comprises removing the second metal nuclei from the portion of the sidewalls.

14

14. The method of claim 12, wherein the cyclic CVD process fills the recess without forming any void.

15. The method of claim 12, wherein the LMI comprises a silane, and the second metal that fills the recess is without any detectable silicon or silane impurity.

16. A method for processing a substrate, the method comprising:

exposing the substrate to a first vapor comprising a small molecular inhibitor (SMI), the substrate comprising a dielectric surface and a first metal surface, the SMI adsorbing on the first metal surface selectively to the dielectric surface;

exposing the substrate to a second vapor comprising a large molecular inhibitor (LMI), the LMI selectively adsorbing on the dielectric surface, the adsorbed SMI preventing the LMI from adsorbing on the first metal surface;

removing the SMI from the first metal surface without removing the LMI from the dielectric surface; and depositing a second metal over the first metal surface by chemical vapor deposition (CVD), wherein a deposition rate over the first metal surface is at least 100 times as high as a deposition rate over the dielectric surface.

17. The method of claim 16, wherein the removing comprises treating the substrate with a gas comprising dihydrogen (H$_2$) at a substrate temperature between 250° C. and 400° C.

18. The method of claim 16, wherein the first metal surface layer comprises Ru, Co, Mo, or W, and wherein the second metal comprises Cu, Ru, Co, Mo, or W.

19. The method of claim 16, wherein the SMI is silicon-free and the LMI comprises silicon.

20. The method of claim 16, wherein the substrate comprises a recess, the recess comprises the dielectric surface as sidewalls and the first metal surface as a bottom surface, the recess having a critical dimension (CD) between 10 nm and 65 nm.

* * * * *